(12) United States Patent
Toyota et al.

(10) Patent No.: US 6,340,635 B1
(45) Date of Patent: Jan. 22, 2002

(54) RESIST PATTERN, PROCESS FOR THE FORMATION OF THE SAME, AND PROCESS FOR THE FORMATION OF WIRING PATTERN

(75) Inventors: Yuji Toyota, Kanazawa; Yoshihiro Koshido, Shiga-ken; Masayuki Hasegawa, Uji, all of (JP)

(73) Assignee: Murata Manufacturing Co., Ltd. (JP)

(*) Notice: Subject to any disclaimer, the term of this patent is extended or adjusted under 35 U.S.C. 154(b) by 0 days.

(21) Appl. No.: 09/433,891

(22) Filed: Nov. 4, 1999

(30) Foreign Application Priority Data

Nov. 19, 1998 (JP) .......................................... 10-329895

(51) Int. Cl.⁷ .............................................. H01L 21/44
(52) U.S. Cl. ..................... 438/670; 438/671; 438/725; 438/782; 438/947; 438/948; 438/949; 438/951; 438/952
(58) Field of Search .................................. 438/670, 671, 438/725, 782, 947, 948, 949, 951, 952

(56) References Cited

U.S. PATENT DOCUMENTS

| | | | | |
|---|---|---|---|---|
| 3,631,772 A | * | 1/1972 | Curran et al. ..................... 95/1 |
| 4,224,361 A | | 9/1980 | Romankiw | |
| 4,581,316 A | | 4/1986 | Yamanouchi | |
| 5,278,419 A | * | 1/1994 | Takahashi et al. ......... 250/492.2 |
| 5,403,685 A | * | 4/1995 | Vidusek et al. ................ 430/18 |
| 5,480,047 A | * | 1/1996 | Tanigawa et al. .............. 216/12 |
| 5,486,449 A | * | 1/1996 | Hosono et al. ............. 430/328 |
| 5,723,236 A | * | 3/1998 | Inoue et al. .................... 430/5 |
| 5,763,143 A | * | 6/1998 | Sakura ....................... 430/330 |
| 5,821,013 A | * | 10/1998 | Miller et al. ................... 430/5 |
| 5,928,815 A | * | 7/1999 | Martin .......................... 430/5 |
| 5,952,160 A | * | 9/1999 | Bakeman, Jr. et al. ....... 430/394 |

FOREIGN PATENT DOCUMENTS

FR 2672138 7/1991

\* cited by examiner

Primary Examiner—John F. Niebling
Assistant Examiner—Lynne A. Gurley
(74) Attorney, Agent, or Firm—Ostrolenk, Faber, Gerb & Soffen, LLP

(57) ABSTRACT

A process for the formation of a wiring pattern, which includes the steps of: exposing a resist through a photomask, the photomask having a pattern whose line width is equal to or less than a resolution limit; and developing the exposed resist to form a resist pattern having groove depressions on the surface thereof, the depressions not reaching the back of the resist pattern. The resist may be a positive resist in which case the resist pattern is formed on an underplate feed film; a plating metal is precipitated on the feed film in a region not covered by the resist pattern; the resist pattern is stripped after the precipitation; and the feed film is selectively removed in a region not covered by the plating metal. Alternatively, the resist may be a negative resist in which case the resist pattern is formed on a substrate; a metallic material is deposited on the resist pattern and the substrate; and the resist is stripped from the substrate to remove the overlying metallic material.

12 Claims, 10 Drawing Sheets

RESIST PATTERN, PROCESS FOR THE FORMATION OF THE SAME, AND PROCESS FOR THE FORMATION OF WIRING PATTERN

BACKGROUND OF THE INVENTION

1. Field of the Invention

The present invention relates to a resist pattern, to a process for the formation thereof, and to a process for the formation of a wiring pattern. More particularly, it relates to a technique for the formation of a resist pattern which is stable in shape, dimensions, accuracy and other characteristics. Furthermore, it relates to a process for the formation of a fine wiring pattern by plating or by a lift off process. The resist pattern, the process for the formation of the resist pattern, and the process for the formation of a wiring pattern can be suitably employed for a semiconductor device manufacturing process or electronic parts manufacturing process which require fine patterning.

2. Description of the Related Art

As processes for the formation of a thick fine wiring having a thickness exceeding 1 μm, there may be mentioned a semi-additive (plating) process as shown in FIGS. 9A to 9G, and a lift off process as illustrated in FIGS. 10A to 10F.

Initially, the semi-additive process will now be described. According to this process, a feed film 32 (or plating base) of a metallic material is formed on a substrate 31 (FIG. 9A), and then a positive resist 33 is applied onto the feed film 32 (FIG. 9B). Subsequently, the resist 33 is exposed to ultraviolet radiation through an aperture 34a of a photomask 34 (FIG. 9C), and then is subjected to development (FIG. 9D). A region of the resist 33 exposed to ultraviolet radiation becomes soluble, and the exposed region is hence dissolved by development to give a resist pattern 35 rectangular in cross section.

After this step, a voltage is applied to the feed film 32 to conduct electroplating, and a plating metal is precipitated on the feed film 32 in a region not covered by the resist pattern 35 (FIG. 9E), to form a plated film 36. After the completion of plating, the resist pattern 35 is stripped (FIG. 9 F), and the feed film 32 is removed by etching in a region not covered by the plated film 36 to give a target wiring pattern 37 on the substrate 31 (FIG. 9G).

Next, the lift off process will be described. According to this process, a negative resist 42 is applied (FIG. 10B) onto the surface of such a substrate 41 as shown in FIG. 10A, and the resist 42 is then exposed to ultraviolet radiation through an aperture 43a of a photomask 43 (FIG. 10C), and the exposed resist is subjected to development (FIG. 10D). The resist 42 in a region exposed to ultraviolet radiation becomes insoluble, and the exposed region remains even after the development to give a resist pattern 44 which is of a reversed taper shape in cross section.

Next, an electrode material 45 is deposited all over the substrate 41 from above the resist pattern 44 (FIG. 10E), and the resist pattern 44 and the electrode material 45 deposited on the resist pattern 44 are stripped off to give a target wiring pattern 46 on the substrate 41 (FIG. 10F).

As is apparent from the aforementioned explanation, both the semi-additive process and lift off process require forming a resist pattern having a thickness greater than the thickness of a target wiring, as their operations demonstrate, and thus require forming a comparatively thick resist pattern. In addition, the resist pattern formed by the semi-additive process must be rectangular in cross section, and that formed by the lift off process must be of a reverse taper shape in cross section.

Furthermore, both of the semi-additive process and lift off process are characterized in that a film of a wiring material is formed after the formation of a resist pattern to give a wiring pattern. The dimensions, shape and accuracy of the wiring pattern therefore reflect the dimensions, shape and accuracy of the resist pattern. Consequently, it is important to retain the shape of the resist pattern until the formation of a film of the wiring material is completed in order to provide a fine wiring pattern sufficiently having target dimensions, shape and accuracy.

According to conventional processes for the formation of a resist pattern, however, the following results, for example, occur when the thickness of a resist film to be formed is increased:

(1) volumetric shrinkage of the resist pattern due to degassing (gas emission) when the resist is baked in a photolithography step, (2) defective film of the wiring material because of a collision between flying particles of the wiring material and gas particles, which gas particles are derived from degassing with increasing temperature in the formation of a film of the wiring material, and (3) stress of the wiring material. The resist sags or deforms because of these results, and an ideal shape of the resist cannot be maintained, and in consequence, a target fine wiring pattern cannot be obtained when a film of the wiring material is formed.

SUMMARY OF THE INVENTION

The present invention has been accomplished to solve the aforementioned technical problems, and its object is to provide a process for the formation of a wiring pattern, which can yield a fine wiring pattern having target dimensions, shape and accuracy while suppressing the deformation of a resist pattern due to heat or stress.

The resist pattern according to the present invention includes a plurality of depressions formed on its surface, the depressions not reaching the back of the resist pattern.

As the present resist pattern has a plurality of depressions formed on its surface, which depressions neither penetrate the pattern nor reach the back of the resist pattern, the volume of the resist pattern can be smaller and the surface area thereof can be greater than normal. Since the volume of the resist pattern can be decreased by forming depressions on the resist pattern as thus described, the volume of degassing upon baking of the resist pattern can be reduced, and the volumetric shrinkage of the resist pattern can therefore be decreased. Furthermore, by making the resist pattern pectinate or comb-like in cross section, a stress applied from the wiring pattern can be decreased and hence deformation due to the stress in the resist pattern can be mitigated.

In addition, as the surface area of the resist pattern is increased, gas can sufficiently be emitted from the resist pattern when the resist pattern is baked. The volume of emitted gas in the film formation step can therefore be reduced to avoid scattering of flying particles of the wiring material by gas particles emitted from the resist pattern and to ensure attachment of a film on the substrate. Consequently, the deformation of the resist pattern due to, for instance, volumetric shrinkage of the resist pattern can be suppressed, and the formation step of a film of the wiring material is not hindered by gas emission from the resist pattern, resulting in the formation of a precise and satisfactory wiring pattern. In this connection, as the depressions do not reach the back of the resist pattern, they do not affect the pattern shape of the wiring pattern.

In particular, a thick resist having a thickness of 2 $\mu$m or more often suffers volumetric shrinkage and/or deformation, and the application of the configuration to a resist having a thickness of 2 $\mu$m or more yields marked advantages.

A process for the formation of a resist pattern according to the present invention includes the steps of: exposing a resist through a photomask and developing the exposed resist, the photomask having a pattern whose line width is equal to or less than a resolution limit, to form depressions on the surface of a resist pattern, the depressions not reaching the back of the resist pattern.

According to the present process for the formation of a resist pattern, depressions can be formed on the surface of a resist pattern in a conventional manner, which depressions do not reach the back of the resist pattern, only by the use of a photomask having a pattern whose line width is equal to or less than the resolution limit. Consequently, conventional exposure equipment or the like can be used as intact, and resist patterns can be formed with facility at low costs.

A process for the formation of metalization according to the present invention includes the steps of: applying a resist onto an underplate feed film, exposing the resist through a photomask, the photomask having a pattern whose line width is equal to or less than a resolution limit, developing the exposed resist to form groove depressions on the surface of a resist pattern, the depressions not reaching the back of the resist pattern, precipitating a plating metal on the feed film in a region not covered by the resist pattern, stripping the resist pattern after the precipitation, and selectively removing the feed film in a region not covered by the plating metal.

The aforementioned process is a process for the formation of a wiring pattern according to a so-called semi-additive process. The application of the process explained above to this process can reduce the volume of, and can increase the surface area of, the resist pattern, and therefore can decrease the volumetric shrinkage of the resist pattern upon baking to give a target shape of the resist pattern. Consequently, a target fine wiring pattern can be formed.

A process for the formation of a wiring according to another aspect of the present invention includes the steps of: applying a resist onto a substrate, exposing the resist through a photomask, the photomask having a pattern whose line width is equal to or less than a resolution limit, developing the exposed resist to form groove depressions on the surface of a resist pattern, the depressions not reaching the back of the resist pattern, depositing a metallic material on the resist pattern and on the substrate, and subsequently stripping the resist from the substrate to remove the metallic material on the resist.

The process just mentioned above is a process for the formation of a wiring pattern according to a so-called lift off process. When the process explained above is applied to this process, the volume of the resist pattern can be smaller and its surface area can be larger than normal, and therefore the volume of degassing with an increasing temperature in the deposition of a metallic material can be decreased, and the volumetric shrinkage and/or deformation of the resist pattern can significantly be suppressed. In addition, by forming projections and depressions on the surface of the resist pattern, the stress of the metallic material can be dispersed in direction, and a stress applied on the edges of the resist pattern can markedly be decreased. By these effects, the deformation of the resist pattern caused by the film formation of the metallic material can be prevented. Moreover, the shape of the resist pattern can be maintained even after the film formation, and a target wiring pattern can be formed by lift-off, and a resist pattern having an exactly intended shape, dimensions, accuracy and the like can be obtained.

For the purpose of illustrating the invention, there is shown in the drawings several forms which are presently preferred, it being understood, however, that the invention is not limited to the precise arrangements and instrumentalities shown.

Other features and advantages of the present invention will become apparent from the following description of the invention which refers to the accompanying drawings.

DETAILED DESCRIPTION OF PREFERRED EMBODIMENTS

Hereinafter, the preferred embodiments of the present invention are explained in detail with reference to the drawings.

(First Embodiment)

Figure 1A:
FIGS. 1A to 1F are cross sectional views showing a process for the formation of a wiring pattern according to an embodiment of the present invention.
Figure 1B:
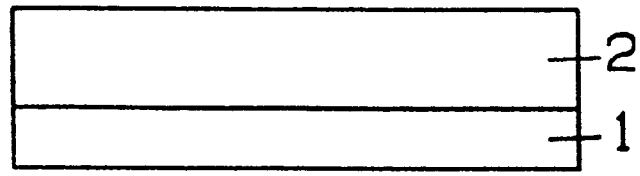

Referring to FIGS. 1A to 1F, a photosensitive chemically sensitized negative resist 2 was rotationally applied to a thickness of 5 $\mu$m on such a glass substrate 1 as shown in FIG. 1A, and the coated resist was prebaked on a hot plate at 90° C. for 90 seconds (FIG. 1B).

Figure 1C:
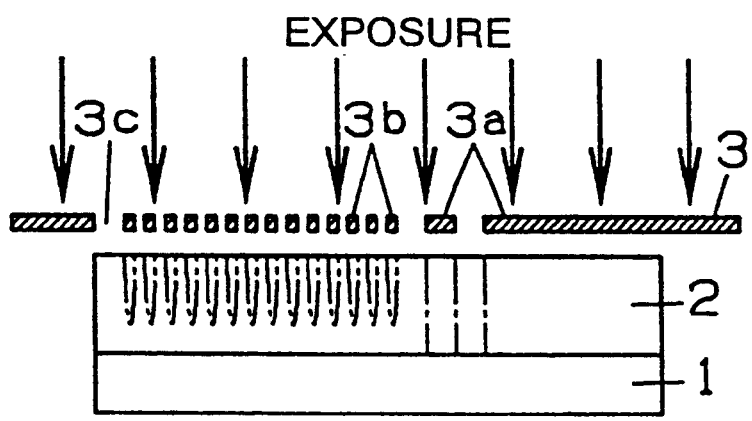
Figure 2:
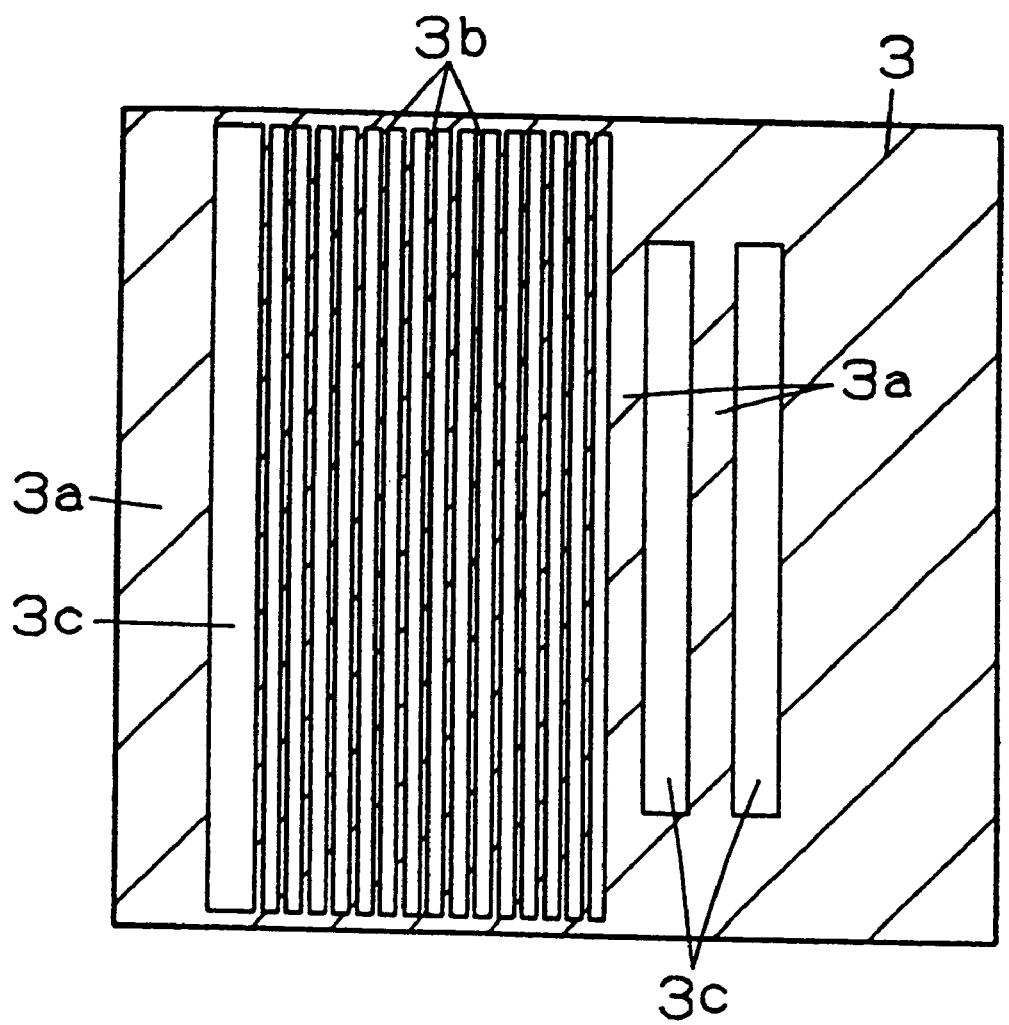
FIG. 2 is a diagram illustrating a photomask used in the above process.

The resist 2 formed on the substrate 1 was exposed to ultraviolet radiation (i-ray) using a photomask 3 (FIG. 1C). In this procedure, an exposure dose was set to overexposure greater than normal. The photomask used herein has a masking pattern 3a and a masking pattern 3b to form grooves 5 described below. The masking pattern 3a is formed in a region where the resist is to be removed and has a line width (5 to 200 µm) equal to or more than the resolution limit. The masking pattern 3b has a line width (1.5 µm) equal to or less than the resolution limit, as shown in FIG. 2 (the regions of the masking patterns 3a, 3b of the photomask are diagonally shaded in FIG. 2). A 5:1 reduction projection aligner (step-and-repeat system) was used for exposure, and the exposure dose was set to 80 mJ/cm$^2$.

Figure 1D:
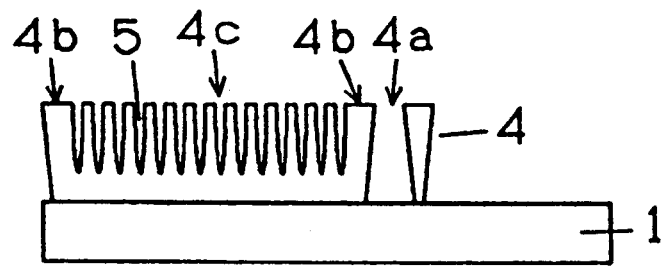
Figure 1E:
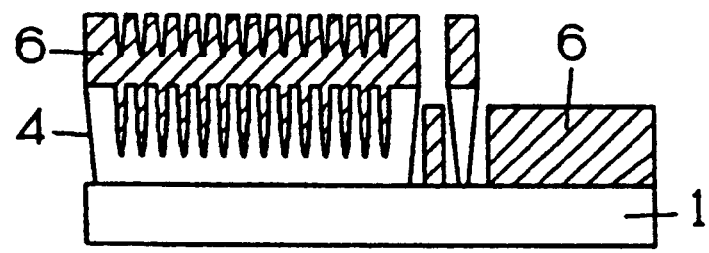

The aforementioned substrate 1 was placed on a hot plate at 110° C. and was post-exposure baked (PEB; Post Exposure Bake) for 60 seconds, and was subjected to developing in an alkaline developer, was cleaned with water, and was dried through an N$_2$ blow to give a resist pattern 4 on the substrate 1 (FIG. 1D). At this stage, the resist pattern 4 on the substrate 1 comprises three types of regions, i.e., a region 4a "where the resist 2 is completely dissolved" (corresponding to the masking pattern 3a), a region 4b "where no resist 2 is dissolved" (corresponding to a transmission region 3c of the photomask 3), and a region 4c "where the resist 2 is not completely but partially dissolved" (corresponding to the masking pattern 3b).

The region 4a where the resist 2 was completely dissolved and removed is a region where the ultraviolet radiation was completely cut off by the masking pattern 3a in the photomask 3, which masking pattern 3a has a line width equal to or more than the resolution limit. The region 4b where no resist 2 was dissolved is a region which was exposed through the transmission region 3c in the photomask 3. The region 4c where the resist 2 was not completely but partially dissolved is a region where the ultraviolet radiation was cut off by the masking pattern 3b having a line width equal to or less than the resolution limit, and is formed pectinate or comb-like and composed of narrow grooves 5 each having such a depth as not to reach the substrate 1, and has a corrugated surface. Furthermore, the edges of the resist pattern 4 are of a reverse taper shape.

Figure 1F:
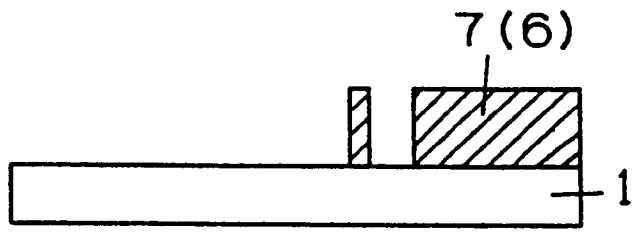

Next, a Ti/Cu film 6 composed of an upper layer of Cu and a lower layer of Ti was formed on the substrate 1 by vapor deposition (FIG. 1E), and the substrate 1 was then dipped in acetone, and the resist pattern 4 and the Ti/Cu film 6 formed on the resist pattern 4 were stripped by lift-off to give a target fine wiring pattern 7 (FIG. 1F). The substrate was not heated during the vacuum deposition, and the thickness of the film was set to Ti: 50 nm and Cu: 4 µm.

When the masking pattern 3b having a line width equal to or less than the resolution limit is formed on a region to be exposed and ultraviolet rays are irradiated to the substrate to dissolve the resist partially and thereby to make the exposed regions pectinate or comb-like in cross section as in the present embodiment, the volume of the resist pattern 4 can be smaller than normal. The volume of gas emitted from the resist pattern 4 with an increasing temperature upon the formation of the Ti/Cu film can therefore be decreased. Consequently, the volumetric shrinkage and deformation of the resist pattern 4 caused by degassing can significantly be suppressed.

In addition, by reducing the volume of degassing upon the formation of the Ti/Cu film, the film-forming particles including Cu and Ti can be protected from a collision with the gas particles, and hence are allowed to deposit on the substrate without hindrance. A wiring pattern can therefore be obtained with high accuracy.

Furthermore, by rendering the resist pattern 4 pectinate or comb-like in cross section, the stress (moment) of the Ti/Cu film is decreased, and the stress applied on the edges of the resist pattern 4 can be substantially reduced. By these effects, the deformation of the resist pattern 4 caused by the formation of the Ti/Cu film can be prevented. In addition, the shape of the resist pattern can be maintained even after the film formation, a target wiring pattern can be formed by lift-off, and the resist pattern 4 having, for instance, an intended shape, dimensions and accuracy can be prepared.

The resist to be used in the present embodiment is not limited to chemically sensitized negative resists, and any kind of resists which can provide shapes capable of lifting off can be employed. The exposure system is as well not limited to a reducing-type projection exposure, and any type of exposure systems that can yield a target resolution can serve to obtain similar advantages. The process for the film formation is also not limited to the vapor deposition process, and any technique in which lift-off can be performed is voluntarily employed. The materials for the substrate and wiring are not limited to those mentioned above, and the embodiment can be applied to other different materials.

(Second Embodiment)

Figure 3A:
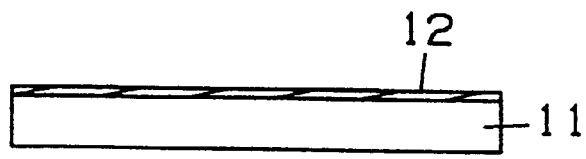
FIGS. 3A to 3G are cross sectional views showing a process for the formation of a wiring pattern according to another embodiment of the present invention.
Figure 3B:
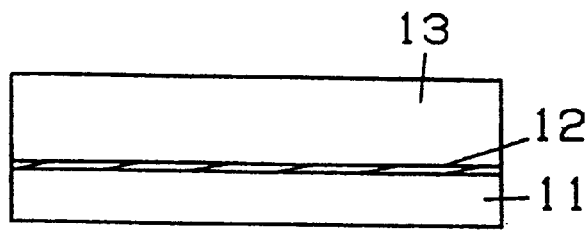

FIGS. 3A to 3G are cross sectional views showing a process for the formation of a wiring pattern according to another embodiment of the present invention. In the present embodiment, a fine wiring is formed by the plating process (semi-additive process). Initially, as shown in FIG. 3A, an underplate feed film (Ti/Au film) 12 composed of an upper layer of Au (200 nm in thickness) and an under layer of Ti (50 nm in thickness) was formed on a sapphire substrate 11; onto the feed film 12, a photosensitive positive resist 13 was rotationally applied to a thickness of 7 m, and the product was prebaked on a hot plate at 100° C. for 90 seconds (FIG. 3B).

Figure 3C:
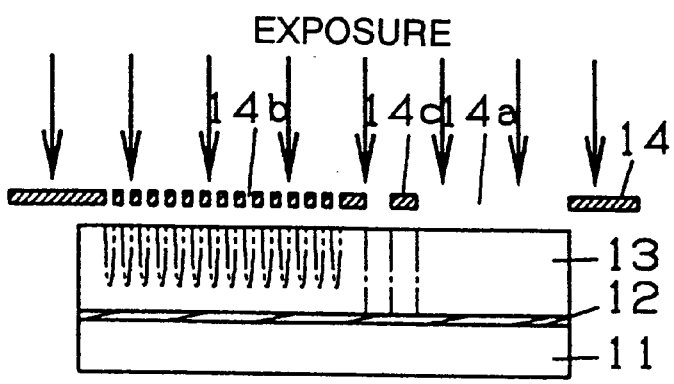
Figure 4:
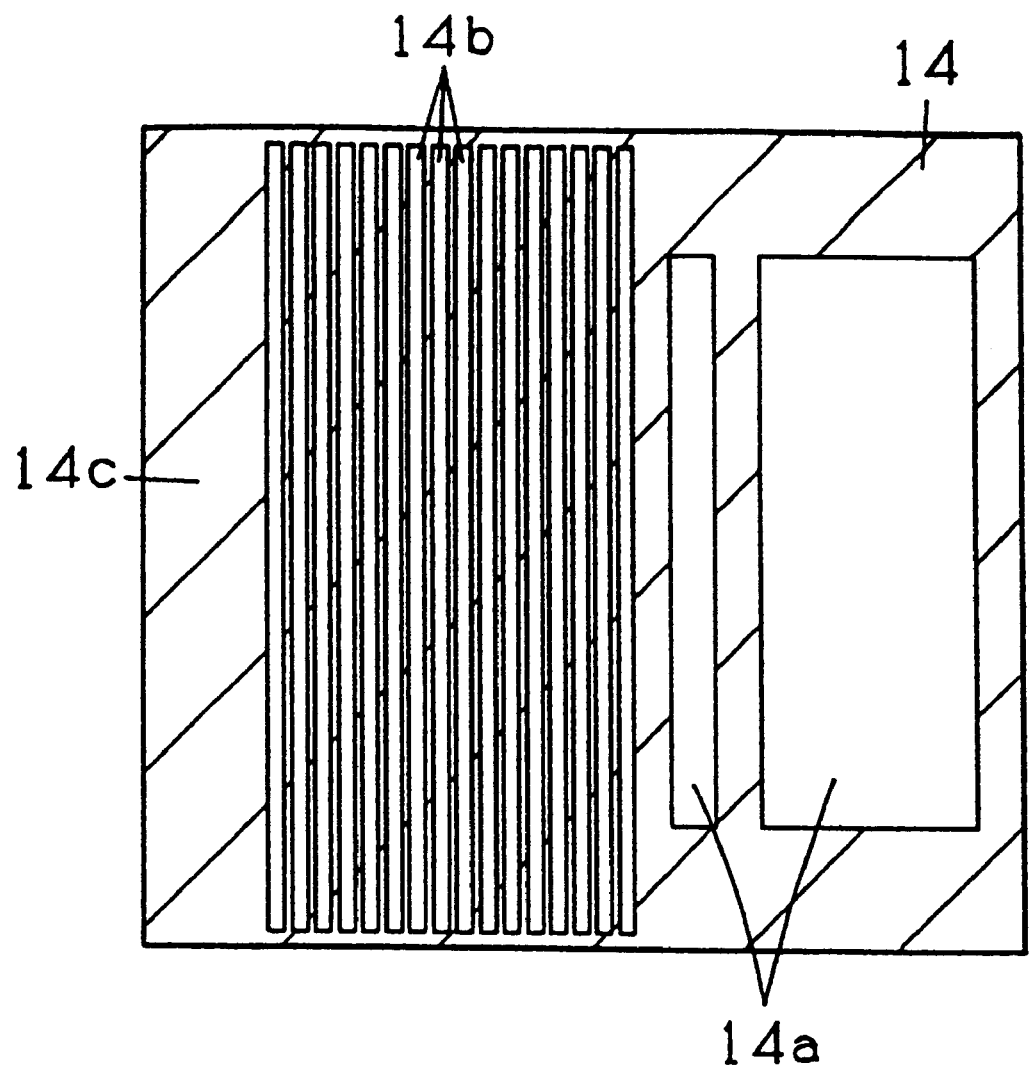
FIG. 4 is a diagram illustrating a photomask used in the above process.

Subsequently, the positive resist 13 formed on the substrate 11 was exposed using a photomask 14 (FIG. 3C). The exposure dose in this step should be set to around a normal dose or somewhat underexpose than normal. The photomask 14 used in this step includes a transmission pattern 14a and a transmission pattern 14b as shown in FIG. 4 (the region of the masking pattern 14c in the photomask 14 is diagonally shaded in FIG. 4). The transmission pattern 14a is formed in a region where the resist 13 is to be removed and has a line width (10 to 400 µm) of equal to or more than the resolution limit, and the transmission pattern 14b has a line width (1 µm) of equal to or less than the resolution limit. A 1:1 projection aligner (mirror projection system) was used in the exposure, and the exposure dose was set to 230 mJ/cm$^2$.

Figure 3D:
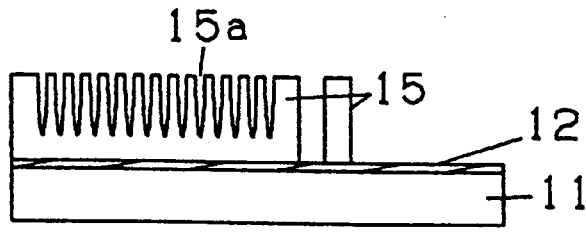

The resultant substrate was subjected to development with an alkaline developer and the exposed region of the resist 13 was dissolved and removed to form a resist pattern 15 (FIG. 3D). Subsequently, the substrate 11 was cleaned with water and was then dried through an N$_2$ blow. The resist was dissolved insufficiently in the exposed region exposed through the transmission pattern 14b having a line width of equal to or less than the resolution limit, and the resist pattern 15 has, in this stage, corrugated projections and depressions (or grooves) 15a as shown in FIG. 3D formed on its surface.

Figure 3E:
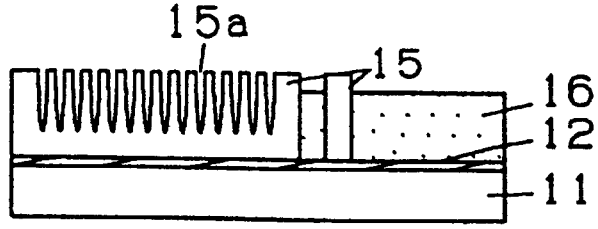
Figure 3F:
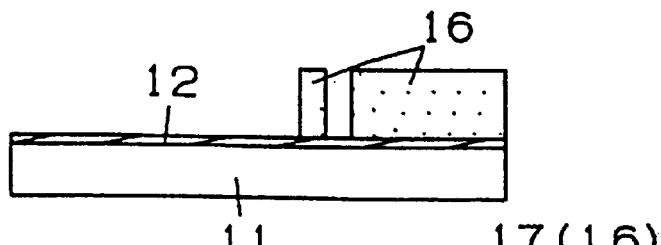
Figure 3G:
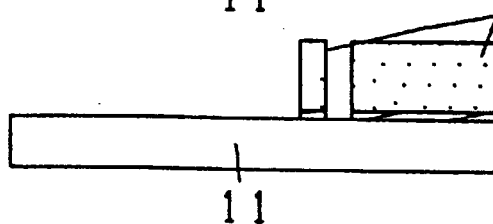

Next, the substrate 11 was baked on a hot plate at 120° C. for 10 minutes, and a film of Au 5 µm in thickness was precipitated by electroplating to form a plated film 16 of Au (FIG. 3E). Thereafter, the substrate 11 was dipped in an organic solvent to strip the resist pattern 15 (FIG. 3F), and the feed film 12 in a region not covered by the plated film 16 was etched and was removed by ion-milling to give a target fine wiring pattern 17 (FIG. 3G).

As in the present embodiment, when the transmission pattern 14b having a line width equal to or less than the resolution limit is also formed in a region to be unexposed, and ultraviolet rays are irradiated thereto, and the resist is partially dissolved and the surface of the unexposed region is made corrugated, the volume of the resist pattern 15 can be decreased and its surface area can be increased. Thus, the volumetric shrinkage of the resist pattern 15 upon baking can be reduced and the volume of degassing in the film-formation of the wiring pattern can be reduced. Consequently, a target shape of the resist pattern can be obtained to give the target fine wiring pattern 17 with high accuracy.

In the present embodiment, as well, the resist to be used is not limited to positive resists, and includes any type of resists that can provide a target shape of the plated film; and the exposure system is as well not limited to a 1:1 projection aligner exposure, and any type of exposure systems that can yield a target resolution can serve to obtain similar advantages. The process for the film formation is also not limited to the electroplating process, and includes electroless plating processes, as well. The materials for the substrate and wiring are not limited to those mentioned above, and any type of materials that can be used for plating processes can be employed.

(Mask Pattern)

Figure 5A:
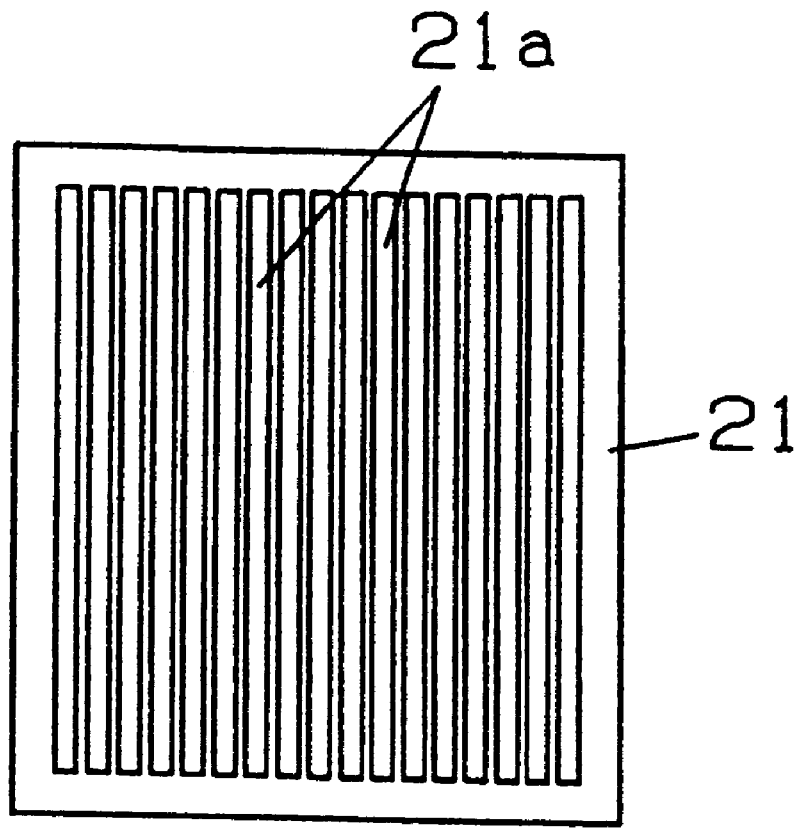
FIG. 5A is a top view showing an example of a photomask.
Figure 5B:
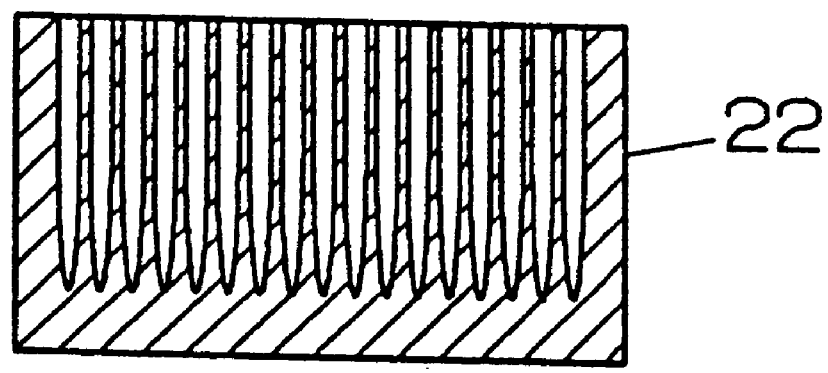
FIG. 5B is a cross sectional view of a resist pattern obtained by exposure and development using this photomask.
Figure 6A:
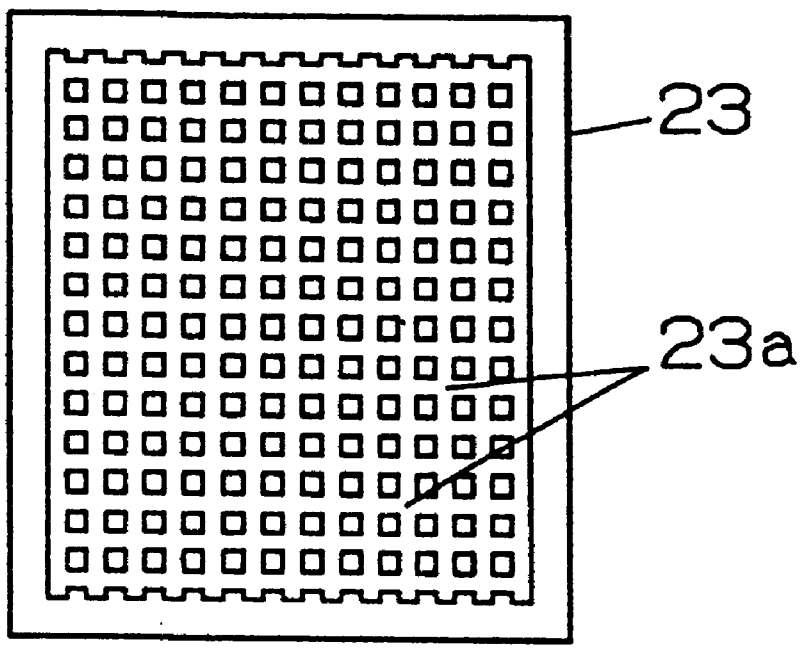
FIG. 6A is a top view showing another example of a photomask.
Figure 6B:
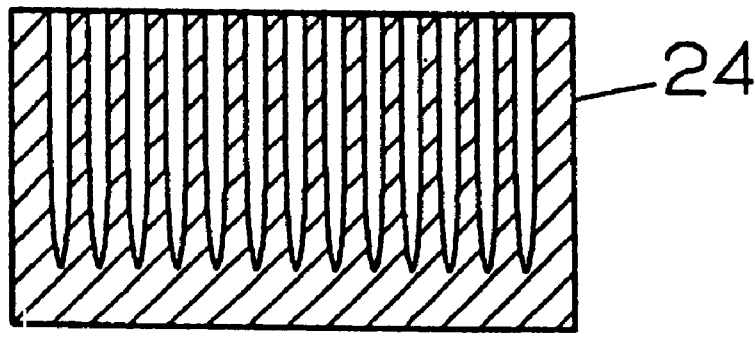
FIG. 6B is a cross sectional view of a resist pattern obtained by exposure and development using the present photomask.
Figure 7A:
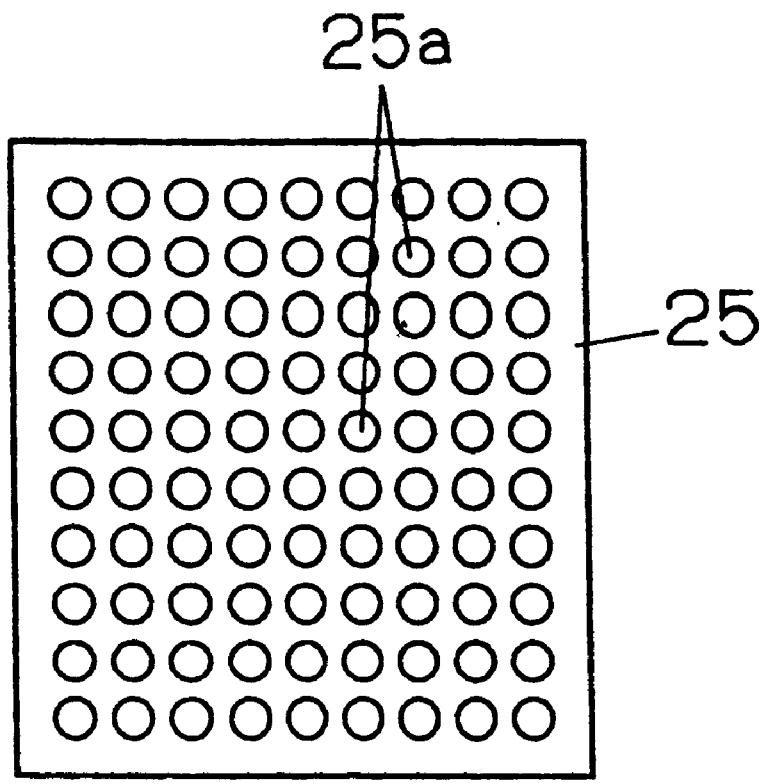
FIG. 7A is a top view showing a further example of a photomask.
Figure 7B:
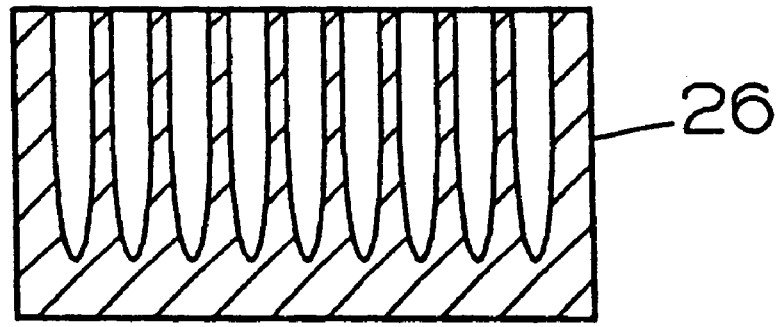
FIG. 7B is a cross sectional view of a resist pattern obtained by exposure and development using the present photomask.
Figure 8A:
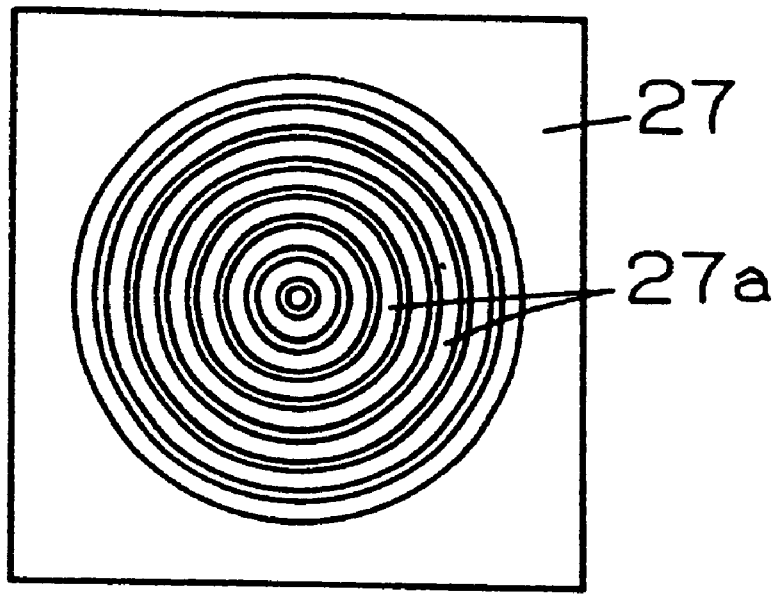
FIG. 8A is a top view showing yet another example of a photomask.
Figure 8B:
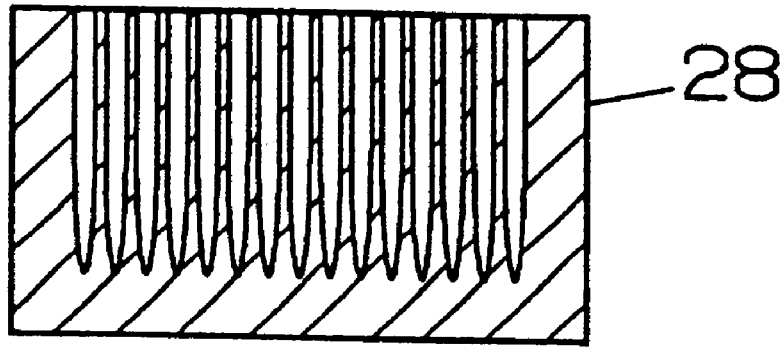
FIG. 8B is a cross sectional view of a resist pattern obtained by exposure and development using the present photomask.
Figure 9A:
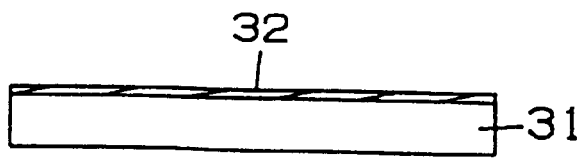
FIGS. 9A to 9G are cross sectional views showing a process for the formation of a wiring pattern by a semi-additive (plating) process.
Figure 9B:
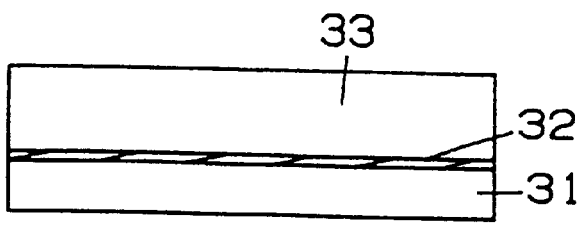
Figure 9C:
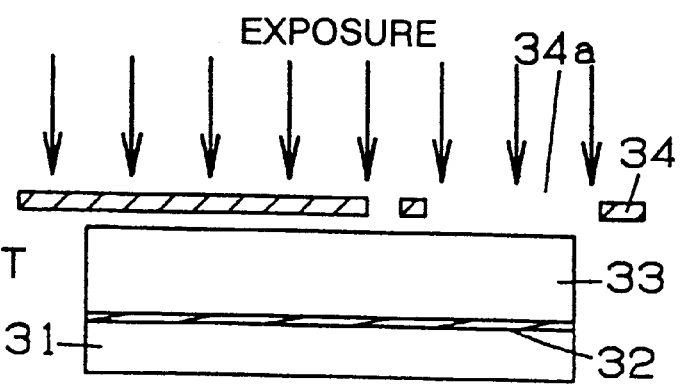
Figure 9D:
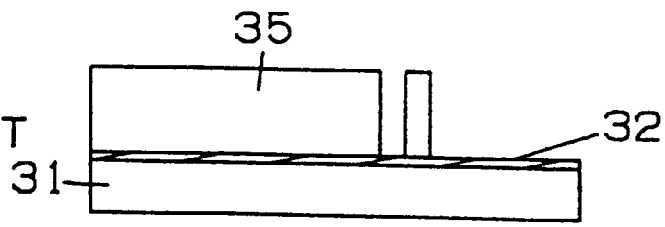
Figure 9E:
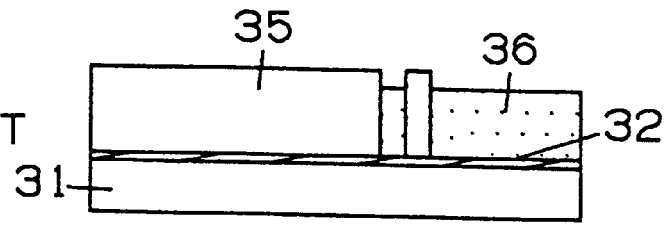
Figure 9F:
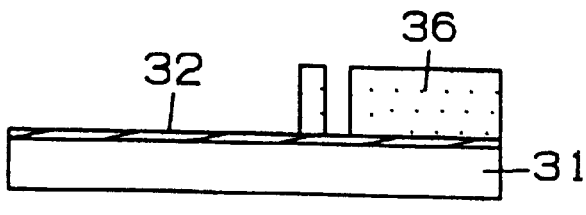
Figure 9G:
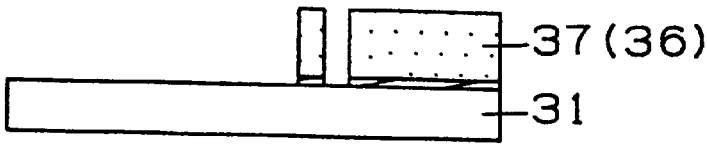
Figure 10A:
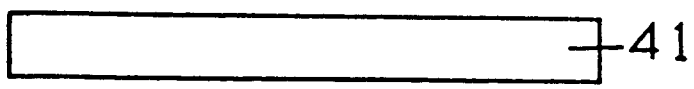
FIGS. 10A to 10F are cross sectional views showing a process for the formation of a wiring pattern by a lift off process.
Figure 10B:
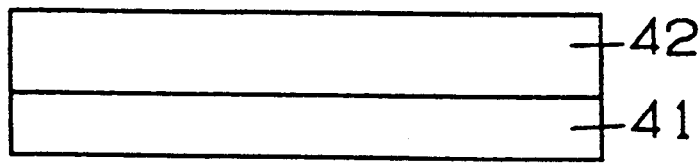
Figure 10C:
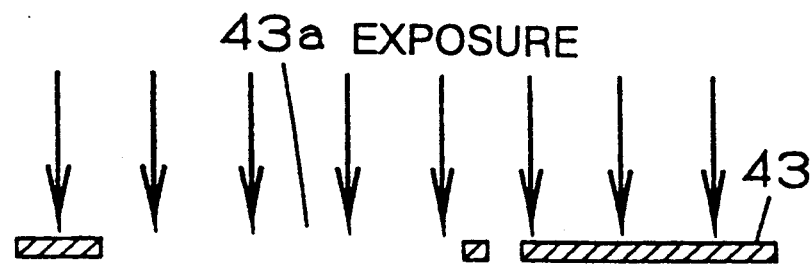
Figure 10D:
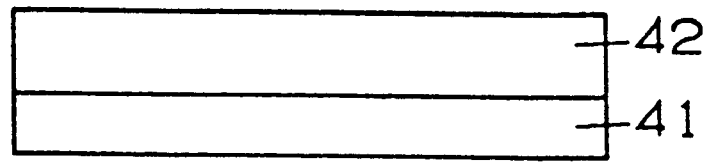
Figure 10E:
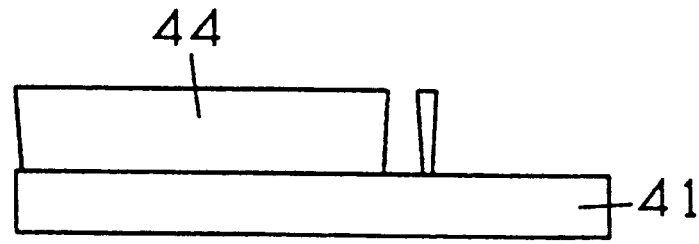
Figure 10F:
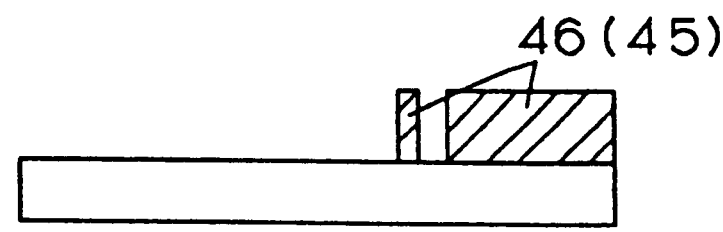

The masking pattern or transmission pattern to be formed on a mask and having a light width of equal to or less than the resolution limit may be in any shape. FIGS. 5A, 5B through FIGS. 8A, 8B respectively illustrate a transmission pattern formed on a photomask and having a line width equal to or less than the resolution limit, and a cross section of a resist pattern formed by the used of the photomask. To be more specific, FIGS. 5A, 5B show the cross section of a resist pattern 22 obtained by exposure and development using a photomask 21 having a linear transmission pattern 21a, which transmission pattern 21a has a line width of equal to or less than the resolution limit. FIGS. 6A, 6B illustrate the cross section of a resist pattern 24 obtained by exposure and development using a lattice-type pattern 23a having a line width of equal to or less than the resolution limit. FIGS. 7A, 7B show a resist pattern 26 obtained by exposure and development using a photomask 25 having a dot pattern 25a, where the dot pattern 25a has a line width of equal to or less than the resolution limit. FIGS. 8A, 8B show a resist pattern 28 obtained by exposure and development using a photomask 27 having a concentric pattern 27a, where the pattern 27a is equal to or less than the resolution limit in line width. Furthermore, the pattern may be in a curved, polygonal, oval or another shape and have a line width of equal to or less than the resolution limit. It may also be of a shape as a combination of these shapes.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A process for the formation of a wiring pattern, said process comprising the steps of:
    applying a resist onto an underplate feed film;
    exposing to a light the resist through a photomask having a first pattern whose line width is less than a resolution limit of the light and a second pattern whose line width is equal to or greater than a resolution limit of the light, with an exposure dose which resolves the second pattern completely;
    developing the exposed resist to form on the underplate feed film a resist pattern having the second pattern and a plurality of depressions which correspond to the first pattern and is provided on a surface of the resist pattern such that the depressions do not reach a surface of the underplate feed film;
    precipitating a plating metal on the feed film in a region not covered by the resist pattern;
    stripping the resist pattern after the precipitation; and
    removing the feed film selectively in a region not covered by the plating metal.

2. A process for the formation of a wiring pattern according to claim 1, wherein said resist is a positive resist.

3. A process for the formation of a wiring pattern, said process comprising the steps of:
    applying a resist onto a substrate;
    exposing to a light the resist through a photomask having a first pattern which defines a region in which the resist is to be remained and whose line width is equal to or greater than a resolution limit of the light and a second pattern provided in the first pattern and whose line width is less than a resolution limit of the light, with an exposure dose which resolves the second pattern completely;
    developing the exposed resist to form on the substrate a resist pattern having the first pattern and a plurality of depressions which correspond to the second pattern and is provided on a surface of the resist pattern such that the depressions do not reach a surface of the substrate;
    depositing a metallic material on said resist pattern and said substrate; and
    subsequently stripping the resist from the substrate to remove said metallic material on the resist.

4. A process for the formation of a wiring pattern according to claim 3, wherein said resist is a negative resist.

5. A process for the formation of a resist pattern, comprising the steps of:
    applying a resist on a substrate;
    exposing to a light the resist through a photomask having a first pattern which defines a region in which the resist is to remain and whose line width is equal to or greater than a resolution limit of the light and a second pattern provided in the first pattern and whose line width is less than a resolution limit of the light, with an exposure dose which resolves the second pattern completely;
    developing the exposed resist to form on the substrate a resist pattern having the first pattern and a plurality of depressions which correspond to the second pattern and is provided on a surface of the resist pattern such that the depressions do not reach a surface of the substrate.

6. A process for the formation of a resist pattern according to claim 5, wherein the first pattern includes a plurality of line regions.

7. A process for the formation of a resist pattern according to claim 5, wherein the first pattern includes a plurality of dotted regions.

8. A process for the formation of a resist pattern according to claim 5, wherein the first pattern includes a plurality of lattice regions.

9. A process for the formation of a resist pattern according to claim 5, wherein the first pattern includes a plurality of concentric rings.

10. A process for the formation of a resist pattern according to claim 5, wherein the resist is negative type.

11. A process for the formation of a resist pattern according to claim 5, wherein the resist is positive type.

12. A process for the formation of a resist pattern according to claim 5, wherein the resist pattern has a thickness of 2 $\mu$m or more.

* * * * *